(12) United States Patent
Griese et al.

(10) Patent No.: US 8,961,201 B2
(45) Date of Patent: Feb. 24, 2015

(54) MOUNTING RAIL BUS SYSTEM

(75) Inventors: Bjoern Griese, Paderborn (DE);
Stephan Lange, Lemgo (DE); Marc Boecker, Steinheim (DE); Michael Kroner, Oerlinghausen (DE); Markus Schnueckel, Detmold (DE); Gorm Rose, Paderborn (DE)

(73) Assignee: Weidmueller Interface GmbH & Co. KG, Detmold (DE)

( * ) Notice: Subject to any disclaimer, the term of this patent is extended or adjusted under 35 U.S.C. 154(b) by 235 days.

(21) Appl. No.: 13/695,408

(22) PCT Filed: May 2, 2011

(86) PCT No.: PCT/EP2011/056953
§ 371 (c)(1),
(2), (4) Date: Oct. 30, 2012

(87) PCT Pub. No.: WO2011/141314
PCT Pub. Date: Nov. 17, 2011

(65) Prior Publication Data
US 2013/0045613 A1  Feb. 21, 2013

(30) Foreign Application Priority Data
May 10, 2010 (DE) .......................... 10 2010 016 865

(51) Int. Cl.
*H01R 25/00* (2006.01)
*H01R 9/26* (2006.01)
(Continued)

(52) U.S. Cl.
CPC ............ *H01R 9/2675* (2013.01); *H01R 9/2658* (2013.01); *H01R 25/14* (2013.01); *H05K 7/1478* (2013.01)
USPC ........................................ 439/121

(58) Field of Classification Search
USPC ......... 439/121, 796, 928, 631, 215, 209, 211, 439/216, 213, 949, 76.1, 76.2; 361/679.39, 361/725, 727, 728, 759, 740, 753, 797, 361/801; 174/52.4
See application file for complete search history.

(56) References Cited

U.S. PATENT DOCUMENTS

| 6,172,877 | B1 * | 1/2001 | Feye-Hohmann et al. ... 361/759 |
| 7,636,615 | B2 * | 12/2009 | Pfingsten et al. ............ 700/286 |
| 7,753,740 | B2 * | 7/2010 | Carolis et al. ................ 439/717 |

FOREIGN PATENT DOCUMENTS

| AT | 278651 B | 2/1970 |
| DE | 41 18 702 A1 | 12/1992 |

(Continued)

*Primary Examiner* — Abullah Riyami
*Assistant Examiner* — Harshad Patel
(74) *Attorney, Agent, or Firm* — Lawrence E. Laubscher, Sr.; Lawrence E. Laubscher, Jr.

(57) ABSTRACT

A mounting rail bus system for supplying power voltage and data signals to a plurality of modules, including a plurality of longitudinally-arranged bus devices mounting the modules in parallel spaced transverse relation on a mounting rail, each of the bus devices including a printed circuit board having parallel strip conductors for transmitting data signals, and a pair of power contact pins for transmitting a power voltage, characterized by the provision of a plurality of generally L-shaped double bushing contact elements have module bush segments for respectively connecting the strip conductors and the contact pins of the bus device with the associated module, and orthogonally arranged partner bush segments for connecting together the strip conductors and pin contacts of adjacent bus devices, respectively, whereby power voltage and data signals are transmitted from the bus device both to the associated module and to the adjacent partner bus device.

10 Claims, 10 Drawing Sheets

(51) Int. Cl.
*H01R 25/14* (2006.01)
*H05K 7/14* (2006.01)

(56) References Cited

FOREIGN PATENT DOCUMENTS

| DE | 44 38 801 C1 | 1/1996 |
| DE | 297 13 960 U1 | 1/1998 |
| DE | 196 51 961 A1 | 6/1998 |
| DE | 198 26 390 A1 | 12/1999 |
| DE | 198 60 465 A1 | 7/2000 |
| DE | 299 16 302 U1 | 4/2001 |
| DE | 202 08 041 U1 | 11/2003 |
| DE | 601 23 984 T2 | 6/2007 |
| DE | 102007006830 A1 | 8/2008 |
| DE | 102007028928 A1 | 1/2009 |
| EP | 0 661 915 A1 | 7/1995 |
| EP | 0709920 B1 | 5/1996 |
| EP | 0896504 A2 | 2/1999 |
| WO | 00/13264 A1 | 3/2000 |

* cited by examiner

MOUNTING RAIL BUS SYSTEM

REFERENCE TO RELATED APPLICATIONS

This application is a continuation of the International application No. PCT/EP2011/056953 filed May 2, 2011, based on the German priority application No. DE10 2010 016 865.3 filed May 10, 2010.

BACKGROUND OF THE INVENTION

1. Field of the Invention

A mounting rail bus system for supplying power voltage and data signals to a plurality of modules, including a plurality of longitudinally-arranged bus devices mounting the modules in parallel spaced transverse relation on a mounting rail, each of the bus devices including a printed circuit board having parallel strip conductors for transmitting data signals, and a pair of power contact pins for transmitting a power voltage, characterized by the provision of a plurality of generally L-shaped double bushing contact elements have module bush segments for respectively connecting the strip conductors and the contact pins of the bus device with the associated module, and orthogonally arranged partner bush segments for connecting together the strip conductors and pin contacts of adjacent bus devices, respectively, whereby power voltage and data signals are transmitted from the bus device both to the associated module and to the adjacent partner bus device.

2. Description of Related Art

It has been proposed in the prior art to provide mounting rail bus systems having a mounting rail upon which one can mount modules that can be lined up next to each other in the manner of a series terminal, which are also referred to as bus partners, and a station bus that is arranged in the mounting rail by means of which the modules can be connected among each other and preferably also with a control or a gateway. The modules preferably in each case have their own electronics, which is connected to the module bus, and they serve, as a rule, for the connection of field units such as actuators, sensors, or initiators.

The station bus supplies the modules with electrical energy and transfers data and/or control signals to the modules from the modules or between them.

The continually growing requirement in control technology for example, in automation technology, results in a demand for mounting rail bus systems that are further optimized in terms of the number of parts, the number of partners, and a contact design.

The present invention was developed to provide an improved rail-mounted module system that avoids the above and other drawbacks of the prior module mounting systems.

SUMMARY OF THE INVENTION

Accordingly, it is a primary object t of the present invention to provide a mounting rail bus system for supplying power voltage and data signals to a plurality of modules, including a plurality of longitudinally-arranged bus devices mounting the modules in parallel spaced transverse relation on a mounting rail, each of the bus devices including a printed circuit board having parallel strip conductors for transmitting data signals, and a pair of power contact pins for transmitting a power voltage, characterized by the provision of a plurality of generally L-shaped double bushing contact elements have module bush segments for respectively connecting the strip conductors and the contact pins of the bus device with the associated module, and orthogonally arranged partner bush segments for connecting together the strip conductors and pin contacts of adjacent bus devices, respectively, whereby power voltage and data signals are transmitted from the bus device both to the associated module and to the adjacent partner bus device.

According to another feature of the invention, address means are provided for identifying the modules that are associated with the various bus devices, respectively, use being made, for each device, of a double bushing contact element of the present invention.

According to a more specific object of the invention, each bus device has contact pins for the transmission and/or manipulation of electrical power supply output and/or with at least one printed circuit board with strip conductors for the transmission of electrical data and/or control signals with preferably reduced power when compared to the power supply output. Here, every contact pin and every strip conductor of the printed circuit board is in each case connected with a double bushing contact element. All double bushing contact elements are, in particular, made identical and can be used both for power transmission and for data transmission, something that results in a rather small multiplicity of parts and reduces the system production costs.

Another advantage consists in the fact that the double bushing contact elements are made both for the transmission of electrical power supply and for the transmission of electrical data and/or control systems of a lesser power output. Therefore, they can be used both for the connection of the contact pins and strip conductors and for the electrical connection of a module which is to be allocated as bus partner. In that way, one can save construction space. A compact design also results when the second bushing segments of the double bushing contact element are arranged essentially orthogonally with respect to the first bushing segments that extend in the longitudinal direction along the mounting rail.

The double bushing contact element, for example, can be made as bent stamping and can have a foot and a connecting surface arranged opposite the foot. That creates a possibility for attachment, both on a contact pin and on a printed circuit board so that no additional adaptation measures are required.

Another compact design results on the basis of a plurality of the double bushing contact elements that are arranged next to each other, whereby the contact pins and the printed circuit board extend in a manner arranged next to each other in each bus member along the longitudinal direction of the mounting rail.

In another embodiment, the station bus is preferably, however, not necessary made also as a mounting rail bus addressing system. The address elements can also be made for the digital manipulation of a signal, for example, frequency doubling, inter-pulse period ratio change, and the like. Here it must be emphasized that the address elements can be made as frequency division device with a determinable, preferably constant, divider factor. Here, for example, a digital signal, for example, a digital square wave signal with a constant frequency that is generated by a frequency generator, is put on the address elements that are connected in series. Each bus member influences this signal in a manner that makes it possible to recognize the total number of influencing bus members.

Particularly advantageous here is the digital utilization by means of a digital microcontroller and the attendant high degree of interference immunity. The number of bus members is limited only by a span of time that is specifically set for address recognition. For example, preference is given to a divider factor of 2.

The invention also relates to a method for addressing bus members of a bus system where the addressing is done with an above-described mounting rail bus system.

The invention furthermore relates to a method for signaling a composite error in an above-described mounting rail bus system.

Furthermore, the described address line (analog as well as digital) can be used for signaling a composite error. Suitable methods for this purpose in case of resistive addressing, for example, would be the periodic short-circuiting of the address signal against a return circuit. This periodic signal then is continued as a voltage change in all bus members. In case of digital addressing, the error report takes place by short-circuiting the digital signal by means of a bus partner. The bus members make sure that this short-circuit is passed on in both directions and that therefore no further addressing signal is produced.

BRIEF DESCRIPTION OF THE DRAWINGS

Other objects and advantages of the invention will become apparent from a study of the following specification, when viewed in the light of the accompanying drawing, in which.

DETAILED DESCRIPTION OF THE INVENTION

Functional units and structural elements with identical reference numbers indicate identical or similar functions. The following explanation relates to a particularly preferred exemplary embodiment to which, however, the invention is not restricted.

Figure 1:
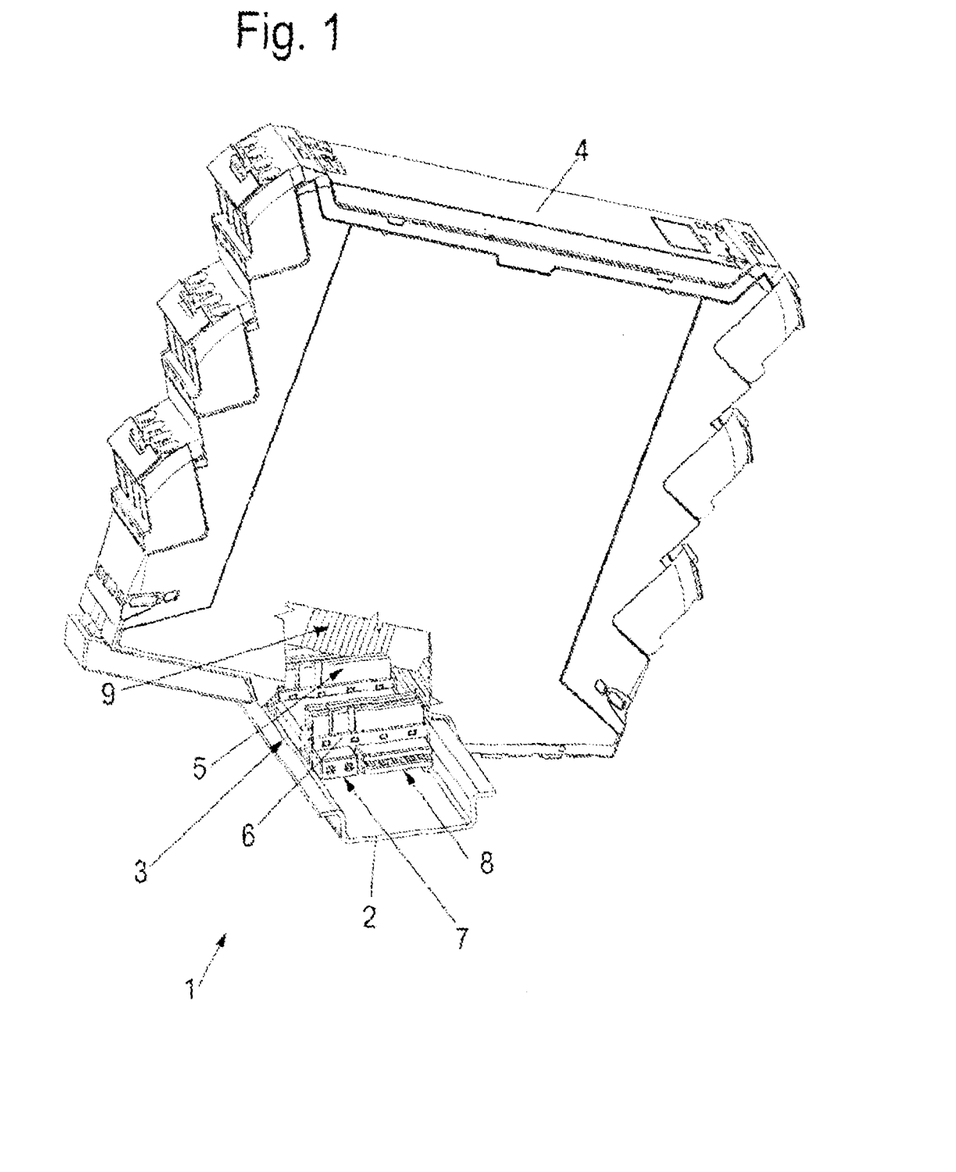
FIG. 1 is a perspective view of a first embodiment of mounting rail bus system according to the present invention.

Referring first to FIG. 1, the mounting rail system 1 comprises a mounting rail 2 that in this case is made as a so-called top hat rail and that has a station bus 3 with at least two mutually connected bus members 6. A module 4, which in this case has various conductor connections (for example, terminal connections) and electronic switching functions that are not explained in any greater detail, can be stuck upon or inserted into the bus members and can be connected with the bus members. Module 4 is also referred to as bus partner of the station bus 3.

Bus members 6 are arranged inside mounting rail 2, for example, they are retained or clamped in a force-locking manner, and in each case, they have a plug-in site 5, which essentially extends orthogonally with respect to mounting rail 2 and which is provided for the insertion of a module plug-in segment of module 4. In FIG. 1, module 4 is shown in a position in which it engages with its underside already on mounting rail 2 and where the module plug-in segment 9 is already partly introduced into plug-in site 5. Bus members 6 are connected with each other via plug-in connections of which in this case we can see on the front bus member 6 a power bushing seat 7 and a data bushing seat 8. This will be explained in greater detail below.

Figure 2:
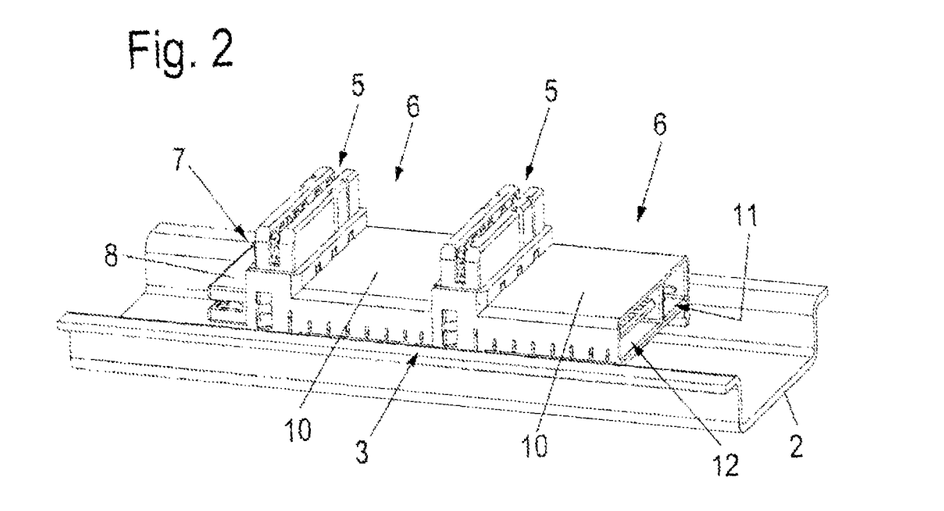
FIG. 2 is a perspective view of two connected bus members of the mounting rail bus system when in the assembled condition according to FIG. 1.
Figure 3:
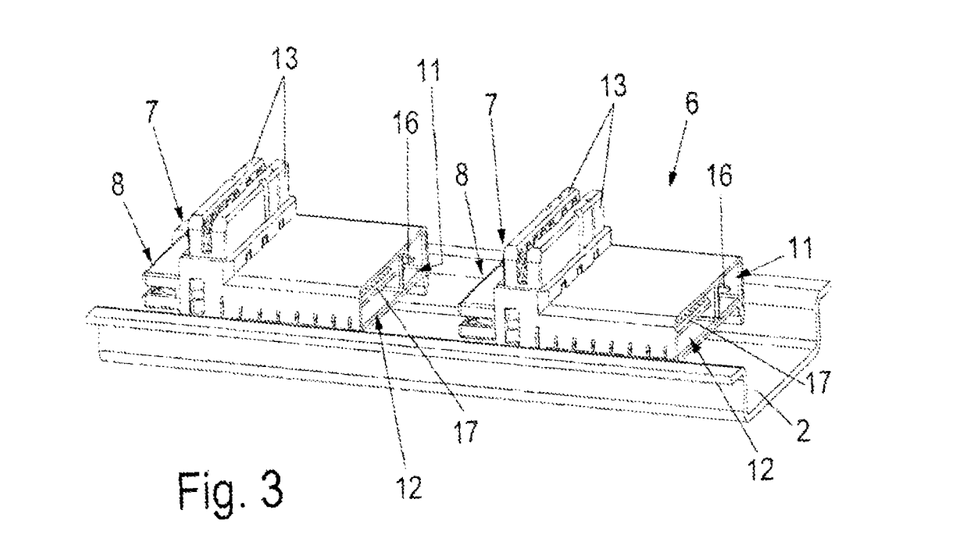
FIG. 3 shows two bus members according to FIG. 1 when in the disconnected condition.

FIG. 2 shows a perspective view of two connected bus members of the inventive mounting rail bus system 1 according to FIG. 1, and FIG. 3 illustrates the two bus members according to FIG. 2 in the disconnected position.

Bus members 6 can be plugged together in the longitudinal direction of mounting rail 2 and can be connected among each other. In this illustrated example, each bus member 6 has a housing 10 with a power bushing seat 7 (in this case, on the left side) and a data bushing seat 8, and on the opposite side (in this case, on the right) a power plug seat 11 and a data plug seat 12. In embodiments not illustrated, each bus member 6 can have either a housing 10 with only one power bushing seat 7 and one power plug seat 11, or a housing 10 with only one data bushing seat 8 and one data plug seat 12. The power bushing seat 7 of the left bus member 6 corresponds to the opposite power plug seat 11 of the right bus member 6 and the data bus seat 8 of the left bus 6 corresponds to the data plug seat 12 of the right bus member 6. The power bus seat 7 and the data bushing seat 8 in each case can be plugged into corresponding plug-in seats 11 and 12 in the longitudinal direction of mounting rail 2. In the process, power plug 16 and data plug 17, which are arranged in plug seats 11 and 12, in each case are introduced into corresponding power contact bushings 18 and data contact bushings 19 (see FIG. 5), which are arranged in bushing seats 7 and 8, and among each other in each case establish electrically conducting contacts.

Figure 4:
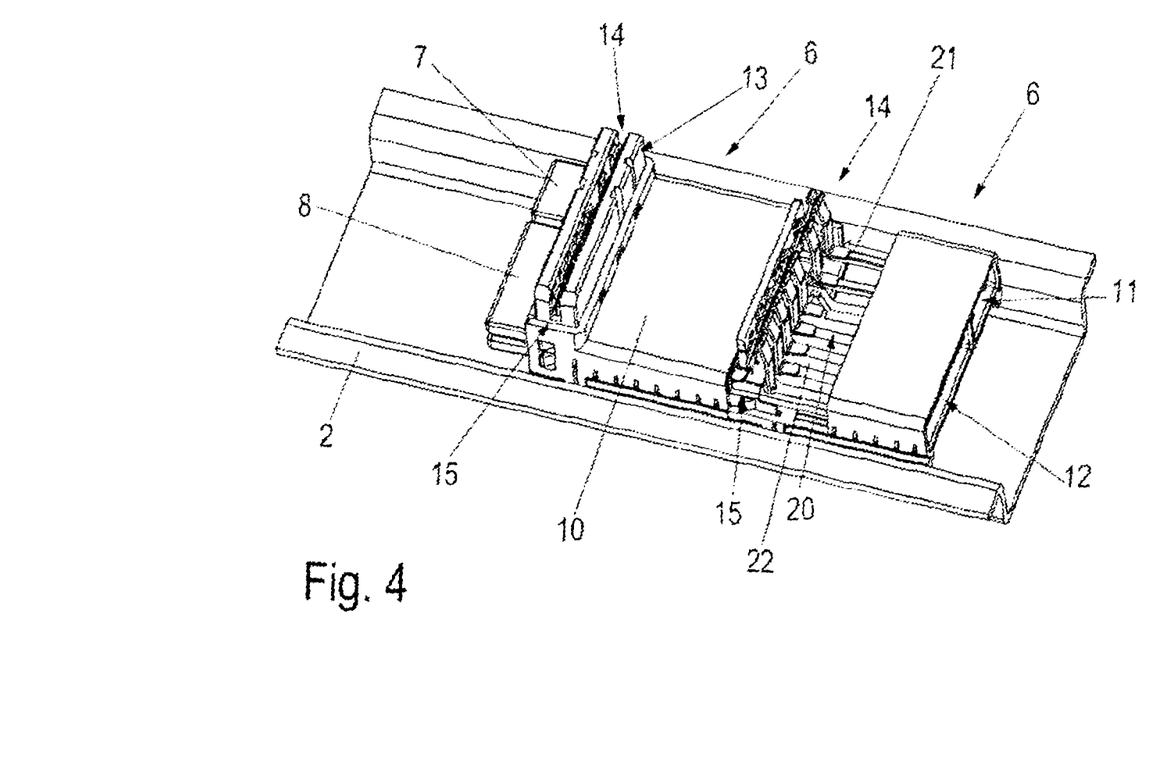
FIG. 4 is a perspective view of the bus members according to FIG. 2 when in a partially disassembled condition.
Figure 5:
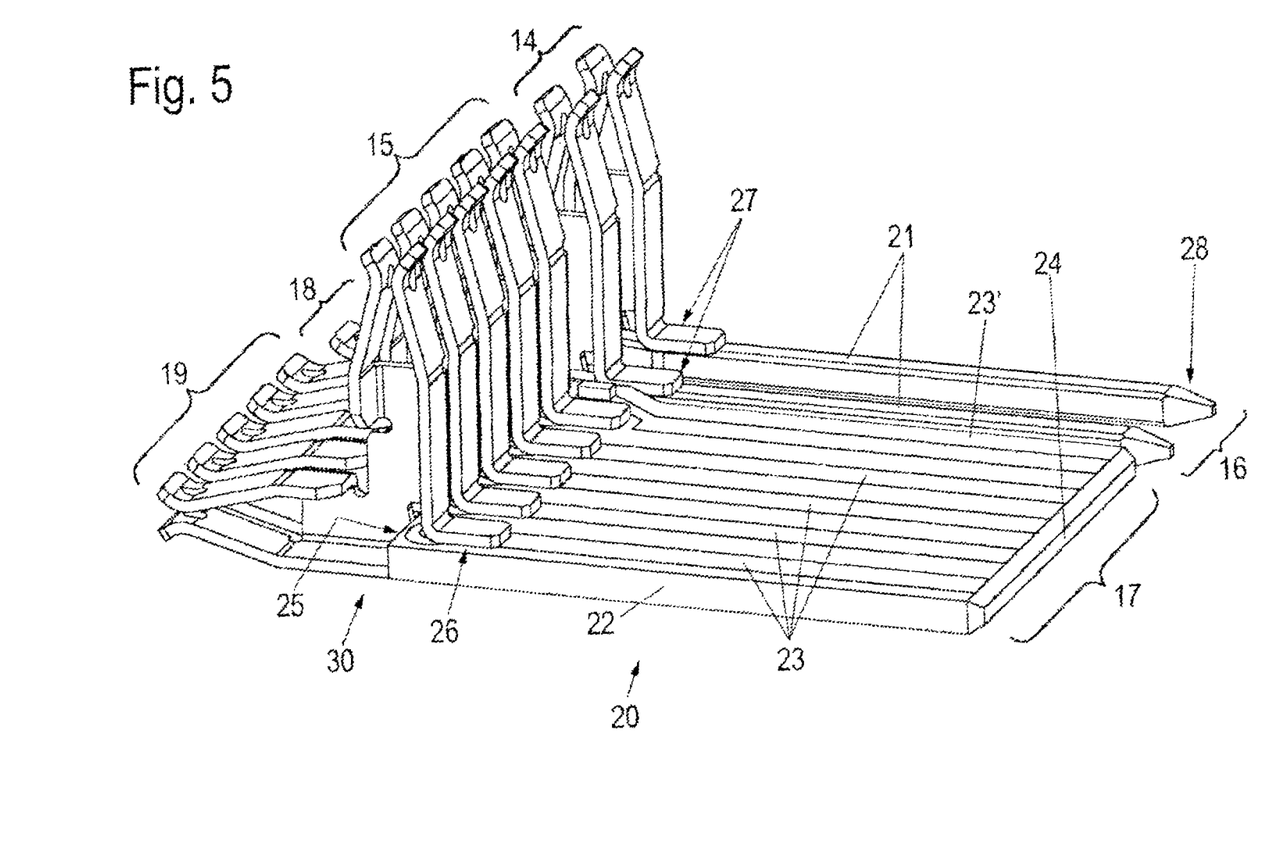
FIG. 5 is a perspective illustration of the bus member conductor arrangement of a double bushing contact arrangement according to FIG. 2.

Plug-in site 5 of a bus member 6 is formed by opposite module plug-in seat walls 13, which are connected with housing 10 and located in between are module contact bushings 14 and 15 (see FIGS. 4 and 5). The module plug seat walls 13 here are provided with guides that are not described in any greater detail and which ensure a definite and unambiguous association of the module plug segment 9 with the module contact bushings 14 and 15.

FIG. 4 illustrates a perspective, partly open view of the connected bus member 6 according to FIG. 2. Here, in a part of the housing 10 of right bus member 6, there is removed an area of the module contact bushings 14 and 15. The module contact bushings 14 and 15 are subdivided into the module power contact bushings 14 and module data contact bushings 15. The module power contact bushings 14 are connected with contact pins 21 and the module data contact bushings 15 are connected with a printed circuit board 22. Such a bus member conductor structure 20 will now be described in conjunction with FIG. 5, which shows a perspective illustration of the bus member conductor structure 20 of the bus member 6 according to FIG. 2.

The bus member conductor structure 20, which is arranged in housing 10, has the printed circuit board 22, which extends in the longitudinal direction of housing 10 and thus in the longitudinal direction of mounting rail 2. Next to printed circuit board 22, there are arranged here two contact pins 21, which extend in the plane of the printed circuit board 22 parallel to the latter.

Printed circuit board 22 is provided with strip conductors 23, which extend in the longitudinal direction of printed circuit board 22 from a contact element side 25 (in this case, on the left) to a plug-in edge 24 of the printed circuit board 22. Here, plug-in edge 24, with the terminal segments of the strip conductors 23 located on them, forms the data plugs 17. Naturally, printed circuit board 22 can also be provided with strip conductors 23 on both sides. Also possible are multilayer printed circuit boards and printed circuit boards with integrated structural components and/or bus bars. The strip conductors 23 have a usual thickness consisting of copper and amounting to, for example, 35 μm and 70 μm, and are provided for the electrical conducting of relatively small current intensities, for example, for data transmission and/or control signals.

On the contact element side 25, there is arranged in each case per strip conductor 23 a double bushing contact element 30, and it is electrically connected, for example, soldered, with a corresponding strip conductor 23 via a connecting segment 26. In this example, five double bushing contact elements 30 are attached next to each other laterally with respect to the longitudinal direction of printed circuit board 22. A certain segment of each double contact element 30 can also be connected mechanically with printed circuit board 22 (see also FIG. 11), for example, it can be glued or possibly soldered (in case of a double-sided platinum coating.

Contact pins 21 consist of a massive metal material, for example, a copper alloy or copper, and are provided for electrical power transmission, for example, with current intensities in the range from 1 A. to 2 A. On the right side, they have tips 28 that lie next to the plug-in edge 17 and that form the power plugs 16. On their other end, in this case, left, the contact pins 21 are also—like the printed circuit board 22—in each case connected with a double bushing contact element 30 in the power connection segments 27.

Figure 6:
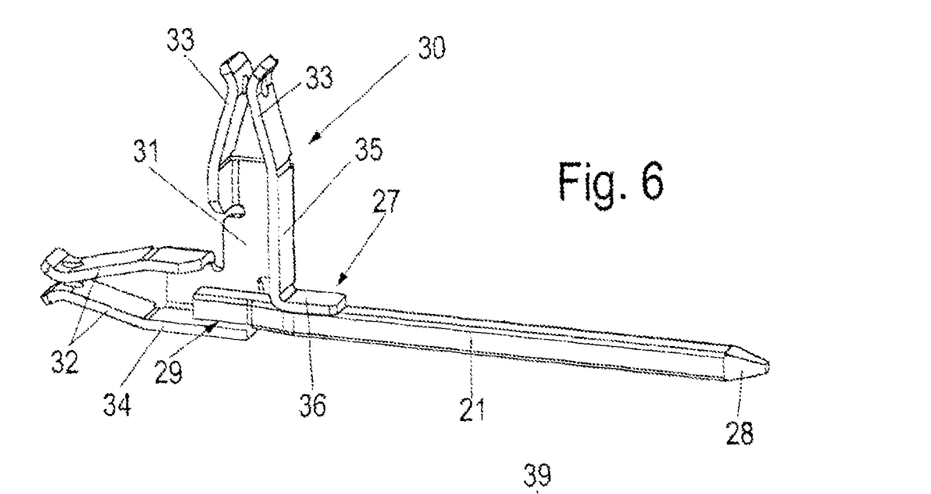
FIG. 6 is a perspective view of an assembly of a contact pin with a double bushing contact element.

FIG. 6 shows a perspective view of a contact pin 21 with a double bushing contact element 30. The double bushing contact element 30 has first and second contact tongues 32, 33, which will be explained in greater detail below and which can be placed upon a base body 31 or connected with it. In power connection segment 27 on the top of the left terminal area of contact pin 21, the double bushing contact element 30 is attached with a foot 36 which in the extension of a second contact tongue 33 is bent over in the longitudinal direction of contact pin 21, for example, it is welded on. On the reverse side of the left end of contact pin 21, double bushing contact element 30, with a contact connection segment 29 that is located on the base body 31 or a bottom segment 34 of the double bushing contact element 30, is likewise attached in the same or similar manner as in the case of foot 36, for example, it is welded on.

Figure 7:
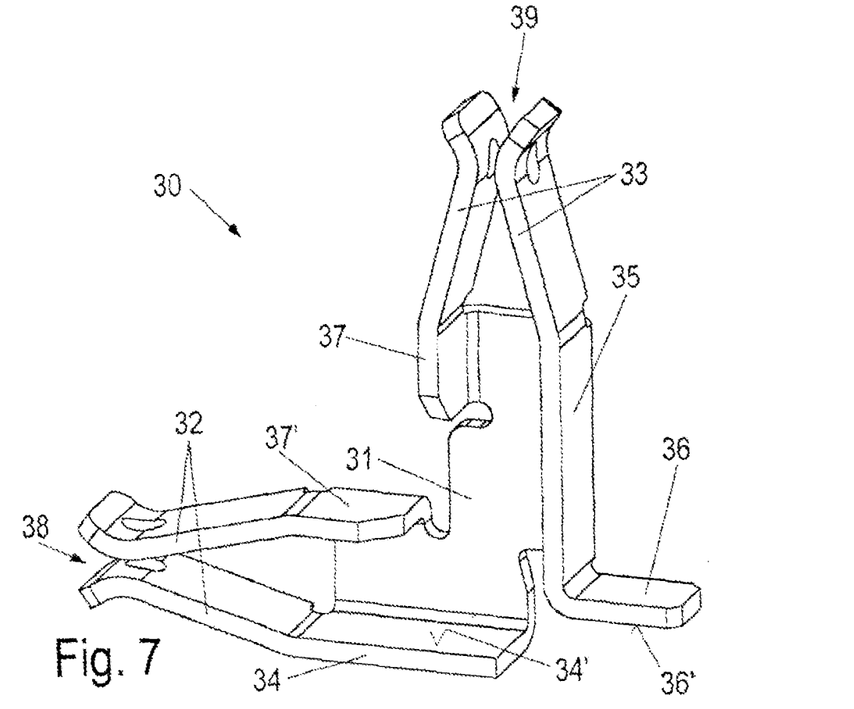
FIG. 7 is a detailed perspective illustration of the double bushing contact element of FIG. 6.

The double bushing contact element 30 will now be further explained on the basis of a perspective view given in FIG. 7. The double bushing contact element 30, for example, is a bent stamping consisting of an electrically conducting material with resilient properties in the area of the first and second contact tongues 32, 33. The contact tongues 32 and 33 in each case are opposite each other in the usual manner and are bent over at a right angle by the base body 31. The vertical base body 31 has a pair of bent parallel spaced horizontal wing portions 34 and 37' that carry the resilient contact tongues 32 of the first bushing segment 38, and a pair of bent parallel spaced vertical wing portions 35 and 37 that carry the resilient contact tongues 35 and 37. The lower end of the vertical wing portion 35 terminates in a horizontal foot portion 36 having a lower fastening surface 36', and the horizontal wing portion 34 has and extension provided with and upper fastening surface 34'.

Here, the first contact tongues 32 form a first bushing segment 38 with mutually adjacent or superposed rounded terminal segments which in the case of connected bus member 6 (see FIGS. 2 and 3) is plugged together and engages the strip conductors 23 of printed circuit board 22 or the segments with the tips 28 of the contact pins 21 of the other bus member 6. The lower first contact tongue 32 is lengthened in the longitudinal direction of printed circuit board 22 (see FIG. 5) or of contact pin 21 (see FIG. 6) in order to form the bottom segments 34 on whose right end there is a connecting surface 34', which forms the contact connection segment 29 (see FIG. 6) or a connection segment to the underside of printed circuit board 22 (see FIG. 5). The opposite first contact tongue 32 is extended with wing portion 37' that runs parallel to the bottom segment 34 but that is only about half as long.

Arranged at a right angle to the first contact tongues 32, which form the first bushing segment 38, are the two contact tongues 33 that are likewise canted over and that form a second bushing segment 39. Here, the left second contact tongue 33, similar to the first upper contact tongue 32, is extended downward with a wing portion 37. The other opposite contact tongue 33 extends in a wing portion 35 downwardly and is bent to define the foot portion 36. Foot portion 36 has an underside surface 36' fastened upon contact pin 21, or it is attached in this manner upon a strip conductor 23 of printed circuit board 22.

The second bushing segment 39 is provided for the contacting of a corresponding segment, for example, strip conductor or contact pin of the module plug-in segment 9 of module 4 (see FIG. 1). The bushing segments 38 form the power contact bushings 18 and the data contact bushings 19 of the bus member conductor structure 20 according to FIG. 5, whereby the bushing segments 39 form the module power contact bushings 14 and the module data contact bushings 15 of the bushing member conductor structure 20 according to FIG. 5. All double bushing contact elements 30 are identical.

Figure 8:
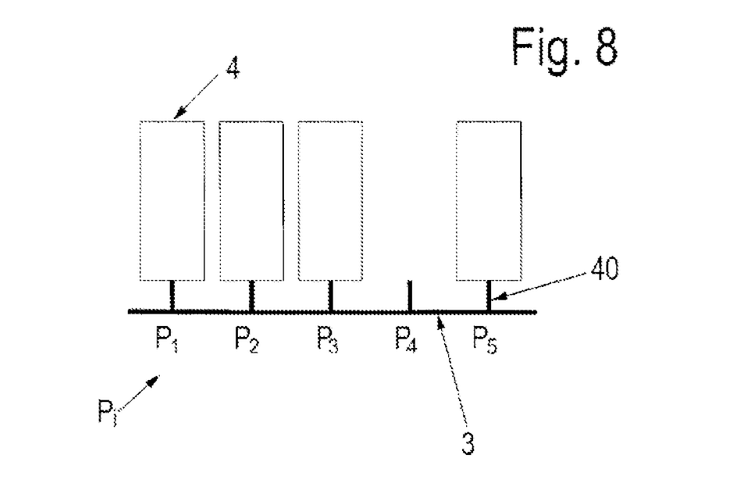
FIG. 8 is a block diagram illustrating a station bus having a plurality of modules.

In another embodiment of the mounting rail bus system 1 according to FIG. 1, the latter has an addressing device 40, which is described in conjunction with FIG. 8. FIG. 8 shows a block diagram of a station bushing 3 with modules 4. Modules 4 are connected with each other electrically via the station bushing 3.

Station bus 3 includes several identical plug-in sites for individual modules 4. In this example, we show five positions P1 to P5 for these plug-in sites, whereby position P4 is not assembled.

In order that modules 4 of a station bus 3 (for example, a station) can communicate with each other, they need an address which here is predetermined by an addressing device 40 that will be described in greater detail below.

Figure 9:
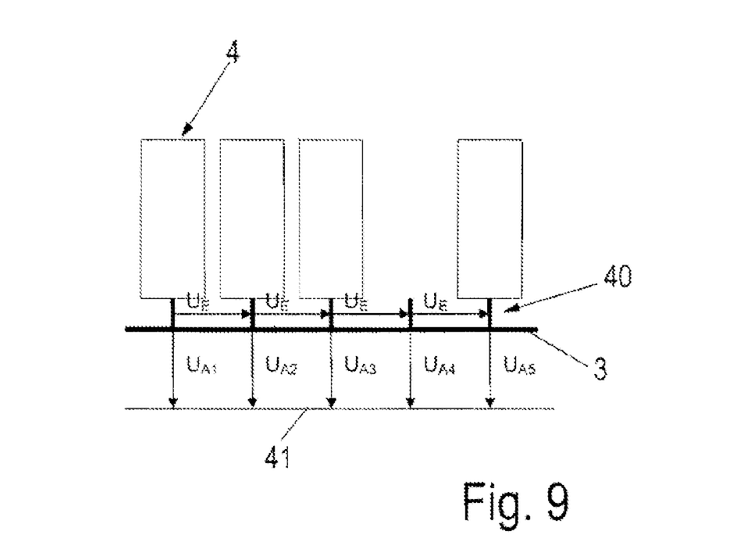
FIG. 9 is a block diagram illustrating the station bus with modules according to FIG. 8 including an indication of the various voltages.

FIG. 9 shows the block diagram of station bus 3 with modules 4 according to FIG. 8 with voltage indications to explain the principle of the addressing device 40. An address is made available to the associated modules 4 as an analog voltage value at particular address taps 30' (see FIG. 10). Each module 4 determines an address volume UA that belongs to it toward a common return line 41 and can determine its address as a multiple of an individual voltage UE that is applied between adjacent address taps 30'. Here it applies that all individual voltages UE per module 4 are equally large. The address is obtained as follows:

$$\text{Address} = UA/UE \qquad (1)$$

whereby: UE=1×R, which will be explained in greater detail below.

Figure 10:
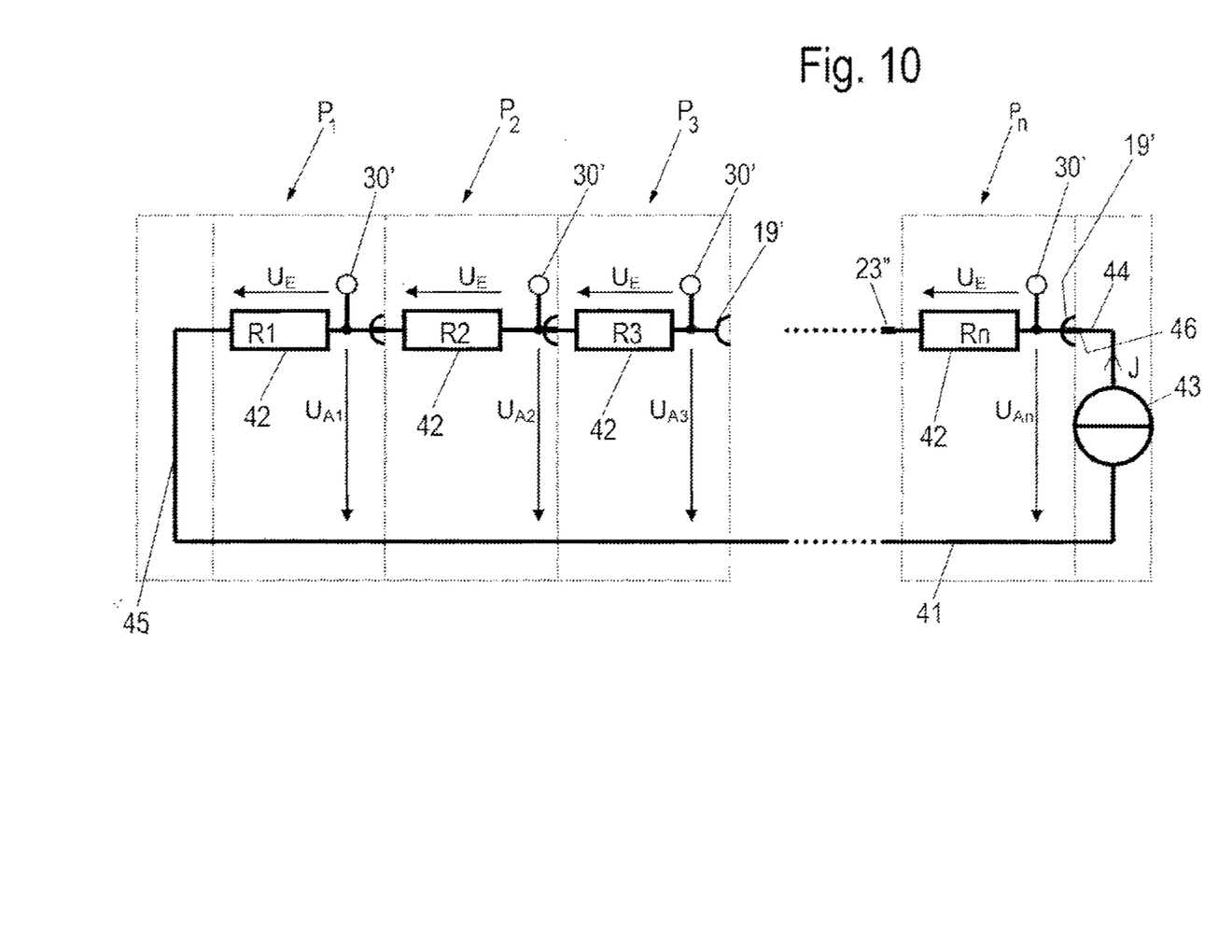
FIG. 10 is a circuit diagram of an addressing device of the station bus with modules according to FIG. 8.

In this connection, FIG. 10 shows a circuit diagram of an addressing device 40 of the station bus 3 with modules 4 according to FIG. 8, wherein n plug-in sites are shown with positions P1 to Pn. At each position Pi, there is arranged an address element 42. This means that each bus member 6 is equipped with such an address element 42 at a corresponding position Pi. In this example, address element 42 is a resistance R (R1 to Rn). These resistances R1 to Rn are electrically connected in series, whereby they are connected via a supply line 44 running via a supply plug 46 with a pole of a constant current source 43 that supplies a current I. The other pole of constant current source 43 is connected with the return line 41 via a bridge conductor 45 with the other end of the series circuit of the resistances R1 to Rn. Each plug-in site of station bus 3 is a bus member 6 with an addressing bushing 19' and a strip conductor segment 23" (see FIGS. 11 and 12). The addressing bushing 19' is connected with the address tap 30'. Thus, the individual voltage UE is here tapped between address tap 30' and the strip conductor segment 23" or via the particular resistance Ri. The particular address voltage UA can be determined between the address tap 30' and the return line 41. The return line 41 is run via a strip conductor 23.

By means of the constant current source 43, we make sure that always the previously defined current I will flow with sufficient accuracy through the series circuit of the resistances R1 to Rn, which form a voltage divider. Assuming we have identical resistance values for resistances R1 to Rn and identical current, UE in each case will be equally large:

$$UE = Ri \times I \qquad (2)$$

$$UAi = Ri \times i \times I \qquad (3)$$

For example, with:
I=1 mA, Ri=1.0 kΩ and i=10 (10 plug-in sites).
we now get UE at 1 V. From (1), (2) and (3), we get the following addresses for the positions P1 to P10 according to Table 1:

TABLE 1

| Position | UA [V] | UE [V] | Address |
|---|---|---|---|
| P1 | 1 | 1 | 1 |
| P2 | 2 | 1 | 2 |
| P3 | 3 | 1 | 3 |
| P4 | 4 | 1 | 4 |
| P5 | 5 | 1 | 5 |
| P6 | 6 | 1 | 6 |
| P7 | 7 | 1 | 7 |
| P8 | 8 | 1 | 8 |
| P9 | 9 | 1 | 9 |
| P10 | 10 | 1 | 10 |

Figure 11:
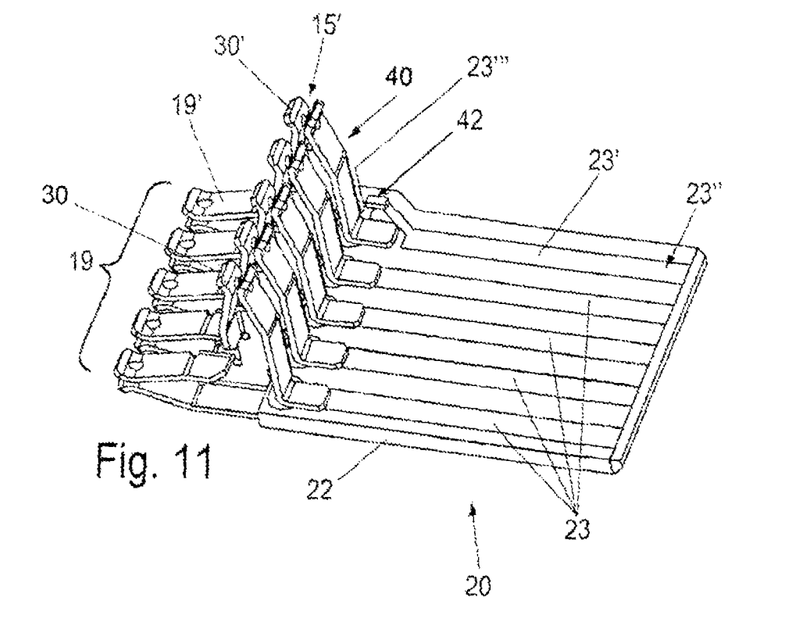
FIG. 11 is a perspective illustration of the bus member conductor structure according to FIG. 5 including a portion of the addressing device according to FIG. 10.
Figure 11A:
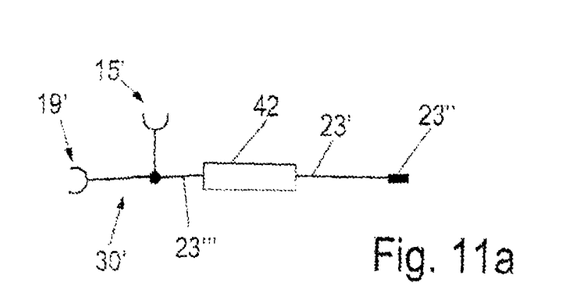
FIG. 11a is a circuit diagram of a portion of the addressing device of the bus member conductor structure according to FIG. 11.

FIG. 11 shows a perspective illustration of the bus member conductor structure 20 according to FIG. 5 with a component of the addressing device 40 according to FIG. 10. FIG. 11a illustrates a circuit diagram of the component of the addressing device 40 of the bus member conductor structure 30 according to FIG. 11.

The strip conductor segment 23" of the printed circuit board 22 forms the plug-in segment to the next bus member 6 or to the bridge 45 (see FIG. 10). The strip conductor 23" connects the plug-in segment with the address element 42, which in this case is made as a resistance in the SMD (surface mounted device) manner and which is attached upon the printed circuit board 22. The resistance or the address element 42 is then connected via another strip conductor segment 23''' with the address tap 30' (double bushing contact component element) in the shape of a module address bushing 15' and the addressing bushing 19'. The return line 41 and the bridge 45 are not shown but can be easily visualized in that the return line 41 is another strip conductor 23 and bridge 45 is inserted on the data contact bushings 19 of a bus member 6 at one end of the station bus 3. A constant current source 43 is connected at the other end of station bus 3.

Figure 12:
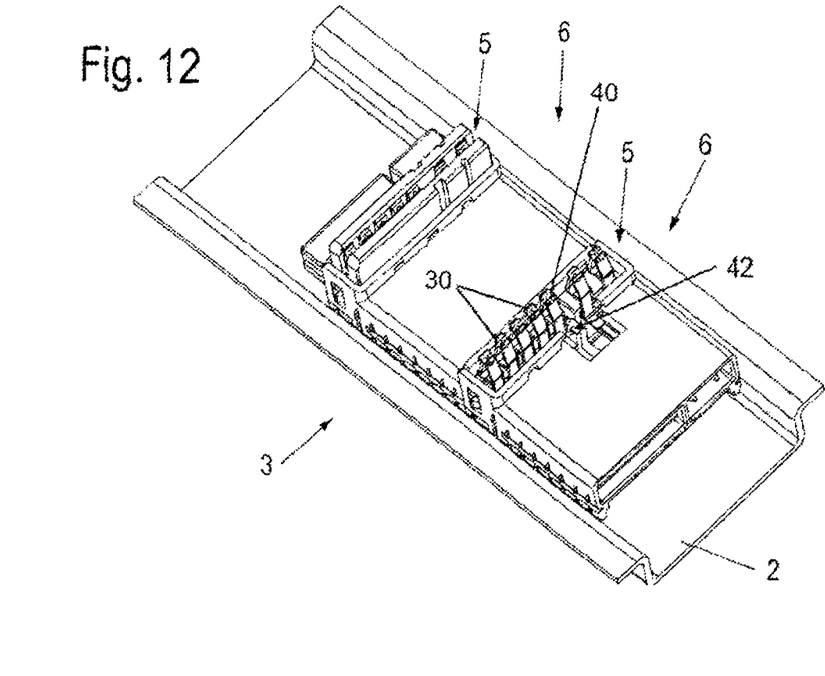
FIG. 12 is a perspective view, with certain parts broken away, of the connected bus members according to FIG. 4 with the bus member conductor structure according to FIG. 10.

FIG. 12 shows a perspective, partly open view of the connected bus member 6 according to FIG. 4 with the bus member conductor structure 20 according to FIG. 10. It is clearly recognizable that the address element 42 in the shape of an SMD component takes up very little space and is arranged in the bus member conductor structure 20 of a bus member 6. When printed circuit board 22 is a printed circuit, the address element 42 can be included in the establishment of the printed circuit board layout.

Figure 13:
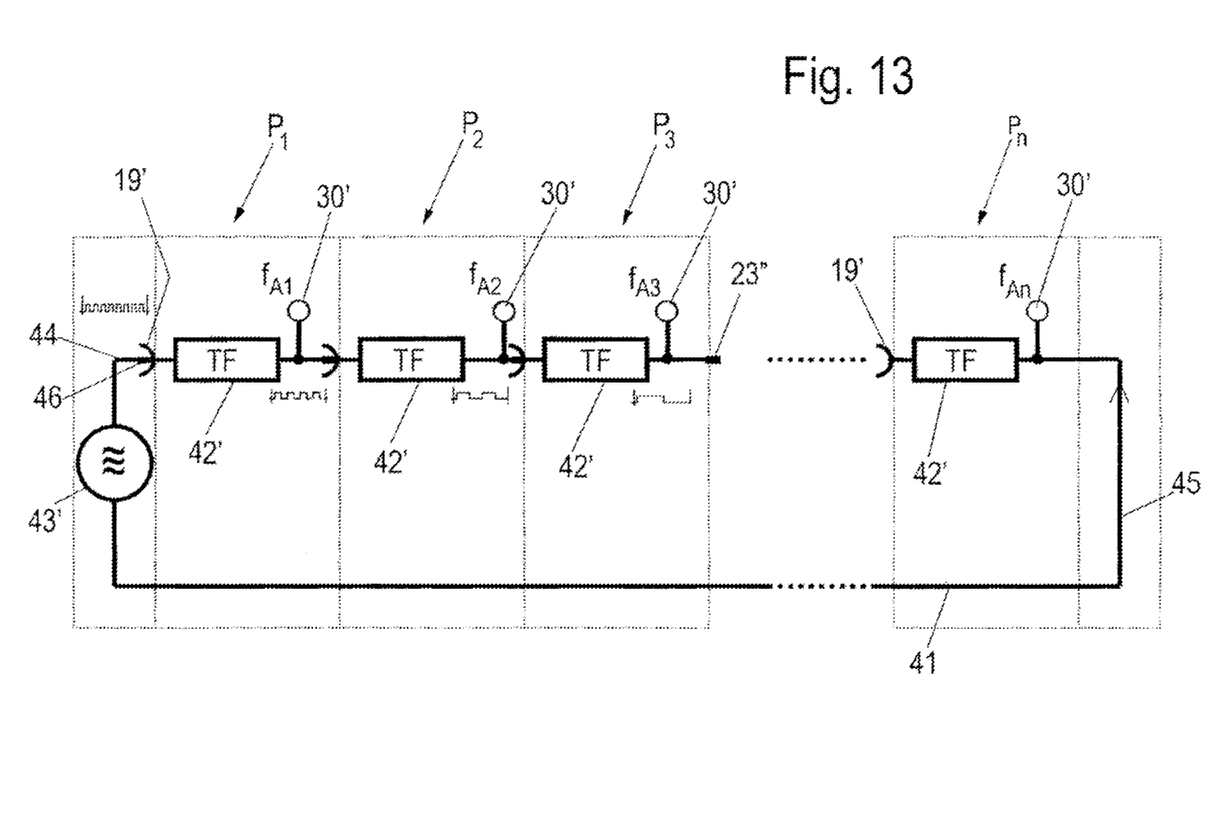
FIG. 13 is a circuit diagram with a further addressing device of the station bus with modules according to FIG. 8.

Finally, FIG. 13 shows a circuit diagram of another addressing device of the station bus with modules according to FIG. 8. FIG. 13 is structured similar to FIG. 10, and therefore only the differences will be explained. A frequency generator 43' supplies a signal with a previously determinable constant frequency f, for example, a digital rectangular signal that is only indicated in FIG. 13. The frequency range of frequency f is so adapted that a reliable and trouble-free addressing is possible, for example, the frequency can be in the range of 4 MHz. As address element 42', we use here the frequency divider devices that in each case have a specific divider factor TF, for example, TF=½. This means that the frequency f that is fed in the supply line plug 46 at the address tap 30' multiplied with the divider factor 14 as address frequency fA1 amounts to half of frequency f (example: f=4 MHz; TF=½; fA1=2 MHz). At the other address taps 30', there is then continually applied in each case half the frequency of the particular input frequency as address frequency fA1. In other words, the pulse time of the rectangular signals is doubled for each step.

Thus, the following addresses are obtained for positions P1 to P10 according to Table 2.

TABLE 2

| Position | Frequency Measured by Module [kHz] | Address |
|---|---|---|
| P1 | 2000.00000 | 1 |
| P2 | 1000.00000 | 2 |
| P3 | 500.00000 | 3 |
| P4 | 250.00000 | 4 |
| P5 | 125.00000 | 5 |
| P6 | 62.50000 | 6 |
| P7 | 31.25000 | 7 |
| P8 | 15.62500 | 8 |
| P9 | 7.81250 | 9 |
| P10 | 3.90625 | 10 |

Here it is particularly advantageous that the particular signal of the pertinent address frequency fAn can be analyzed digitally, for example, by a microcontroller. That facilitates a high degree of trouble-free operation and reliability of address recognition.

The invention is not restricted to the above-explained exemplary embodiment. It is conceivable, for example, that one uses a conductor grid instead of the printed circuit board 22.

The segments of the strip conductors 23 in the area of the plug-in edge 24 can be silver coated or gold coated in order to improve contacting, that is to say, to reduce a transmission contact resistance. This can also be the case with contact pins 21 in the area of tips 28.

The address element 42 can also be another electronic component, for example, a condenser, an inductance, or also an active component, for example, a diode or a breakdown diode. Besides, the described address line (analog as well as digital) can be used for signaling a composite error. Suitable procedures on this score in the case of resistive addressing (addressing device according to FIG. 10) by way of example are the periodic short-circuiting of the address signal at 0 V, that is to say, the address tap 30' is connected with return line 41, whereby, however, one can rule out any damage to the constant current source 43 or the frequency generator 43'. This periodic signal is then continued as a voltage change in all bus members. In case of digital addressing, as in the case of the further addressing device according to FIG. 13, the error report is transmitted by short-circuiting the digital signal by means of a bus partner. The bus members must make sure that these short-circuits are relayed in both directions and that no further addressing signal is thus generated.

An addressing or an address recognition procedure can also be performed with only one predetermined time interval.

While in accordance with the provisions of the Patent Statutes the preferred forms and embodiments of the invention have been illustrated and described, it will be apparent to those skilled in the art that changes may be made without deviating from the invention described above.

What is claimed is:

1. A mounting rail bus system for supplying power voltage and data signals to a rail-mounted module (4), comprising:
   (a) a generally U-shaped top-hat mounting rail (2);
   (b) at least two generally rectangular electronic modules (4);
   (c) a plurality of bus devices (6) operable to mount said modules in parallel spaced transverse relation on said mounting rail at a given bus station (3), respectively, each of said bus devices including:
      (1) a printed circuit board (22) having a plurality of parallel strip conductors (23) for transmitting data signals;
      (2) a pair of power contact pins (21) arranged parallel with said strip conductors for transmitting power voltages; and
      (3) a plurality of generally L-shaped double bushing contact elements (30) operable to conduct both higher-voltage power voltages and lower-voltage data signals, said double bushing contact elements including:
         (a) a plurality of vertical module bush segments (39) for respectively connecting said strip conductors and said contact pins of the associated bus device with the associated module, thereby to transmit data signals and power voltages from the associated bus device to the associated module, respectively: and
         (b) a plurality of horizontal partner bush segments (38) for connecting together the strip conductors and pin contacts of two of said bus devices, respectively, thereby to transmit power voltages and data signals from the associated bus device to the adjacent partner bus device, said partner bush segments and said module bush segments for each of said double busing contact elements being arranged orthogonally relative to each other;
         (c) each of said double bushing elements further including a mounting foot portion (36) that extends in the opposite direction from said partner bush segments, said mounting foot portion being connected with one of the strip conductors and power contact pins of the associated bus device.

2. A mounting rail bus system as defined in claim 1, wherein said strip conductors and said power contact pins extend longitudinally relative to the associated bush device.

3. A mounting rail bus system as defined in claim 2, wherein each of said double bushing contact elements is formed by bending a blank punched from a resilient conductive metal sheet, each of said elements including:
   (a) a vertical base portion (31);
   (b) a pair of vertical parallel spaced bent wing portions (35, 37), each of said vertical wing portions having an upper end carrying a vertical resilient module bush segment (33) adapted for connection with an associated module; and
   (c) a pair of horizontal parallel spaced wing portions (34, 37'), each of said horizontal wing portions having a first end carrying a horizontal resilient partner bush segment (32) adapted for connection with the partner bus device;
   (d) said horizontal foot portion (36) extending from an extended lower portion of one of said vertical wing portions outwardly in the opposite direction from said partner bush segments, said foot portion being adapted for connection with one of the strip conductor and power pin contacts of the associated bus device.

4. A mounting rail bus system as defined in claim 1, and further including:
   (d) address means (40) for identifying the various modules at each bus station, said address means including:
      (1) a plurality of address components (42; 42') associated with said station bus devices (6), respectively;
      (2) a voltage source (43; 43'); and
      (3) circuit means connecting said address components in series with said voltage source, thereby to define a module identifier device.

5. A mounting rail bus system as defined in claim 4, wherein said address components are resistors (42); wherein said voltage source is a constant current voltage source (43); and further wherein said module identifier device is an analog voltage divider circuit.

6. A mounting rail bus system as defined in claim 5, and further including means for periodically short-circuiting the address signal, thereby to define a periodic analog signal.

7. A mounting rail bus system as defined in claim 4, wherein said address components are frequency-responsive devices (42'); wherein said voltage source is a constant frequency source (43') of a digital square wave signal; and further wherein said module identifier device is a digital frequency divider circuit.

8. A mounting rail bus system as defined in claim 7, wherein said frequency-responsive devices have different predetermined divider factors (TF).

9. A mounting rail bus system as defined in claim 4, wherein for each bus device said address component is mounted on the associated printed circuit board, and said circuit means comprises:

(a) a double bush contact element (40) having a module bush segment (15') connected with the associated module, and a partner bus segment (19') connected with a partner bush device;

(b) a first strip conductor (23') of said printed circuited board connected at one end with said address component and at the other end with one end of said voltage source;

(c) a second strip conductor (23''') connecting the other end of said address component with said module bus segment; and (d) a return conductor 41 connecting the partner bus segment (19') with the other end of said voltage source.

10. A mounting rail bus system for supplying power voltage and data signals to a rail-mounted module (4), comprising:

(a) a generally U-shaped top-hat mounting rail (2);

(b) at least two generally rectangular electronic modules (4);

(c) a plurality of bus devices (6) operable to mount said modules in parallel spaced transverse relation on said mounting rail at a given bus station (3), respectively, each of said bus devices including:

(1) a printed circuit board (22) having a plurality of parallel strip conductors (23) for transmitting data signals;

(2) a pair of power contact pins (21) arranged parallel with said strip conductors for transmitting power voltages; and (3) a plurality of contact means (30) for respectively connecting said strip conductors and said contact pins of the associated bus device with the associated module, thereby to transmit data signals and power voltages from the associated bush device to the associated module, respectively, and for connecting together the strip conductors and pin contacts of said two bus devices, respectively, thereby to transmit power voltages and data signals from the associated bus device to the adjacent partner bus device; and (d) address means (40) for identifying the various modules at each bus station, said address means including:

(1) a plurality of address components (42; 42') associated with said bus devices (6), respectively;

(2) a voltage source (43; 43'); and (3) circuit means connecting said address components in series with said voltage source, thereby to define a module identifier device.

\* \* \* \* \*